(12) United States Patent
Kim (10) Patent No.: US 9,601,588 B2
(45) Date of Patent: Mar. 21, 2017

(54) METHOD FOR FABRICATING SEMICONDUCTOR DEVICE

(71) Applicant: SK hynix Inc., Gyeonggi-do (KR)

(72) Inventor: Hyung-Kyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/572,498

(22) Filed: Dec. 16, 2014

(65) Prior Publication Data

US 2015/0104934 A1    Apr. 16, 2015

Related U.S. Application Data

(62) Division of application No. 13/610,230, filed on Sep. 11, 2012, now abandoned.

(30) Foreign Application Priority Data

May 30, 2012  (KR) .......................... 10-2012-0057433

(51) Int. Cl.
| | | |
|---|---|---|
| *H01L 29/423* | (2006.01) | |
| *H01L 29/78* | (2006.01) | |
| *H01L 21/762* | (2006.01) | |
| *H01L 27/108* | (2006.01) | |
| *H01L 29/66* | (2006.01) | |

(52) U.S. Cl.
CPC .... *H01L 29/4236* (2013.01); *H01L 21/76232* (2013.01); *H01L 27/10876* (2013.01); *H01L 29/665* (2013.01); *H01L 29/6656* (2013.01); *H01L 29/78* (2013.01)

(58) Field of Classification Search
None
See application file for complete search history.

(56) References Cited

U.S. PATENT DOCUMENTS

| 2003/0173333 A1* | 9/2003 | Wang ..................... H01J 37/321 216/67 |
| 2009/0298248 A1* | 12/2009 | Fung ................. H01L 21/76283 438/296 |
| 2013/0093093 A1* | 4/2013 | Lee .................... H01L 27/10855 257/770 |

* cited by examiner

*Primary Examiner* — Matthew Reames
*Assistant Examiner* — Steven B Gauthier
(74) *Attorney, Agent, or Firm* — IP & T Group LLP (57) ABSTRACT

A method for fabricating a semiconductor device includes: forming isolation layers and active regions in a substrate, wherein each of the active regions is formed between the isolation layers; forming a silicide layer in each of the active regions; forming trenches and silicide layer patterns simultaneously by etching the silicide layer and each of the active regions, wherein each of the trenches is located between the silicide layer patterns; forming a buried gate in each of the trenches; forming an inter-layer dielectric layer that covers the buried gate and the silicide layer patterns; and forming a first opening that exposes one silicide layer pattern among the silicide layer patterns by selectively etching the inter-layer dielectric layer, wherein the silicide layer patterns are formed before the buried gate is formed.

5 Claims, 9 Drawing Sheets

METHOD FOR FABRICATING SEMICONDUCTOR DEVICE

CROSS-REFERENCE TO RELATED APPLICATIONS

This application is a division of U.S. patent application Ser. No. 13/610,230 filed on Sep. 11, 2012, which claims priority of Korean Patent Application No. 10-2012-0057433, filed on May 30, 2012. The disclosure of each of the foregoing application is incorporated herein by reference in its entirety.

BACKGROUND

1. Field

Exemplary embodiments of the present invention relate to a semiconductor device designing technology, and more particularly, to a semiconductor device that includes contact plugs and a method for fabricating the semiconductor device.

2. Description of the Related Art

A semiconductor device, for example, a Dynamic Random Access Memory (DRAM) device, has a multi-layer structure where a plurality of constituent elements are stacked. The semiconductor device includes a plurality of contact plugs to couple the constituent elements. Typically, the contact plugs are formed through a series of processes for forming an insulation layer over a substrate where a given structure is formed, selectively etching the insulation layer to form openings that expose the predetermined structure, and filling the openings with a conductive material.

However, because the linewidth (or area) of the openings continuously decreases as the integration degree of a semiconductor device increases, the contact area between the contact plugs and the structure that the contact plugs contact with decreases, and thus, contact resistance increases, which becomes a concern. To solve this concern, a technology for forming a silicide layer on the surface of the structure that contacts with the contact plugs after the openings are formed, and forming a conductive material over the silicide layer to decrease the contact resistance is introduced.

According to the conventional technology, the silicide layer for reducing contact resistance is formed through a series of processes for forming an insulation layer over a substrate that includes a structure to contact with contact plugs, selectively etching the insulation layer to form openings, forming a metal layer along the surface of the structure that includes the openings, performing a thermal treatment to form a silicide layer on the surface of the structure, and removing the remaining metal layer that is left behind without reacting after the thermal treatment.

Although it is desirable to form a silicide layer over the surface of the structure that is exposed through the openings according to the conventional technology, the silicide layer may be formed only on a portion of the exposed surface of the structure during the formation of the silicide layer due to a decrease in the area of the openings (or linewidth) and an increase in the aspect ratio that are caused by increased integration degree. In a worse case, the silicide layer may not be formed at all, because it is difficult to form a metal layer having a uniform and sufficient thickness on the bottom surface of the openings, which is the surface of the structure exposed through the openings, due to the decrease in the area of the openings and an increase in the aspect ratio. Also, because the method of depositing the metal layer is restricted in consideration of step coverage based on the aspect ratio of the openings, there is a concern in that the productivity of semiconductor devices may be deteriorated.

Also, since the process of forming the silicide layer is accompanied by a thermal treatment necessarily, thermal load applied on the pre-established structure is increased, which may be a concern as well.

SUMMARY

Exemplary embodiments of the present invention are directed to a semiconductor device that has a contact resistance easily decreased by a silicide layer although the integration degree of a semiconductor device is increased, and a method for fabricating the semiconductor device.

In accordance with an exemplary embodiment of the present invention, a semiconductor device includes a substrate including an active region, an insulation layer formed over the substrate, a plurality of openings formed in the insulation layer, a plurality of contact plugs filling the plurality of openings, and a silicide layer formed over the substrate and between the substrate and each contact plug of the contact plugs in order to cover a bottom of each contact plug.

In accordance with another exemplary embodiment of the present invention, a method for fabricating a semiconductor device includes forming a substrate including a plurality of active regions, forming a silicide layer over the substrate including the plurality of active regions, forming a plurality of trenches by etching the silicide layer and the substrate, forming a plurality of buried gates in the plurality of trenches, forming an inter-layer dielectric layer that covers a profile of the substrate, and forming a plurality of openings that expose the silicide layer by selectively etching the inter-layer dielectric layer.

In accordance with yet another exemplary embodiment of the present invention, a method for fabricating a semiconductor device includes forming an isolation layer for defining a plurality of active regions in each region of a substrate having a first region and a second region, forming a silicide layer over the substrate including the active regions of the first region, forming a plurality of trenches by etching the silicide layer and the substrate of the first region, forming a plurality of buried gates in the plurality of trenches, forming an inter-layer dielectric layer on a profile of the substrate, and forming a plurality of openings that expose the silicide layer by selectively etching the inter-layer dielectric layer.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

The following exemplary embodiments of the present invention provide a semiconductor device that includes a conductive structure, such as contact plugs and conductive lines, that may easily decrease contact resistance by using a silicide layer although the area (or linewidth) of openings is decreased and/or the aspect ratio of the openings is increased due to increased integration degree of the semiconductor device, and a method for fabricating the semiconductor device. In the following embodiments of the present invention, contact plugs that contact with junction regions (which are source/drain regions) of transistors, where the increase in contact resistance following the increase in the integration degree is the major issue, are exemplarily described.

Figure 1A:
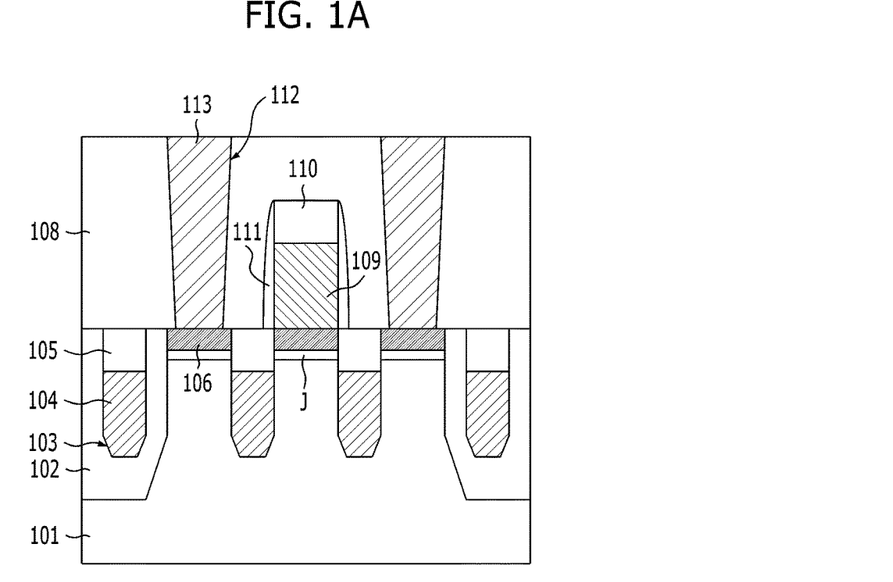
FIG. 1A is a cross-sectional view illustrating a semiconductor device in accordance with an embodiment of the present invention.

FIG. 1A is a cross-sectional view illustrating a semiconductor device in accordance with an embodiment of the present invention. Referring to FIG. 1A, an isolation layer 102 for defining active regions is formed on a substrate 101. The isolation layer 102 may be formed through a Shallow Trench Isolation (STI) process. The active regions defined by the isolation layer 102 may have a shape of islands or lines.

A silicide layer 106 is formed on the surface of the substrate 101. The silicide layer 106 reduces the contact resistance between the substrate 101 and a conductive structure. The silicide layer 106 may be a titanium silicide layer or a cobalt silicide layer. It is also possible to form the silicide layer 106 of a material other than titanium silicide or cobalt silicide based on the characteristics required by a semiconductor device.

A plurality of buried gates are formed on the substrate 101. The buried gates may include trenches 103, a gate insulation layer (not shown), a gate electrode 104, and a sealing layer 105. The trenches 103 are formed by etching the silicide layer 106 and the substrate 101. The gate insulation layer (not shown) is formed on the surface of the trenches 103. The gate electrode 104 fills a portion of each trench 103 over the gate insulation layer (not shown). The sealing layer 105 fills the other portion of each trench 103 over the gate electrode 104. The gate electrode 104 may be a semiconductor layer such as a silicon layer, a metal layer, or a stacked layer that includes semiconductor layer and a metal layer. The sealing layer 105 may be an insulation layer. Junction regions J that contact with the bottom surface of the silicide layer 106 may be formed in the substrate 101 under the silicide layer 106 whose shape is defined by the isolation layer 102 and the buried gates.

An insulation layer 108, a conductive line, openings 112, and contact plugs 113 are formed over the substrate 101. The conductive line contacts with the silicide layer 106. The insulation layer 108 covers the profile of the substrate 101 that includes the conductive line. The openings 112 penetrate through the insulation layer 108 and expose the silicide layer 106 where both sides of the conductive line are disposed. The contact plugs 113 fill the openings 112. The conductive line may be a bit line, and the conductive line may include a bit line conductive layer 109 that contacts with the silicide layer 106, a bit line hard mask layer 110 formed over the bit line conductive layer 109, and bit line spacers 111 formed on the sidewalls of the bit line conductive layer 109 and the bit line hard mask layer 110. The contact plugs 113 may be storage node contact plugs, and the openings 112 may be a hole type.

Because the semiconductor device that has the above structure has a structure where the silicide layer 106 whose shape is defined by the isolation layer 102 and the buried gates that cover the entire contact area between the contact plugs 113 and the substrate 101, the contact resistance between the contact plugs 113 and the substrate 101 may be reduced regardless of the area and aspect ratio of the openings 112. In other words, because the area exposed by the openings 112 is equal to or greater than the area of the silicide layer 106, the contact resistance between the contact plugs 113 and the substrate 101 may be easily decreased.

Figure 1B:
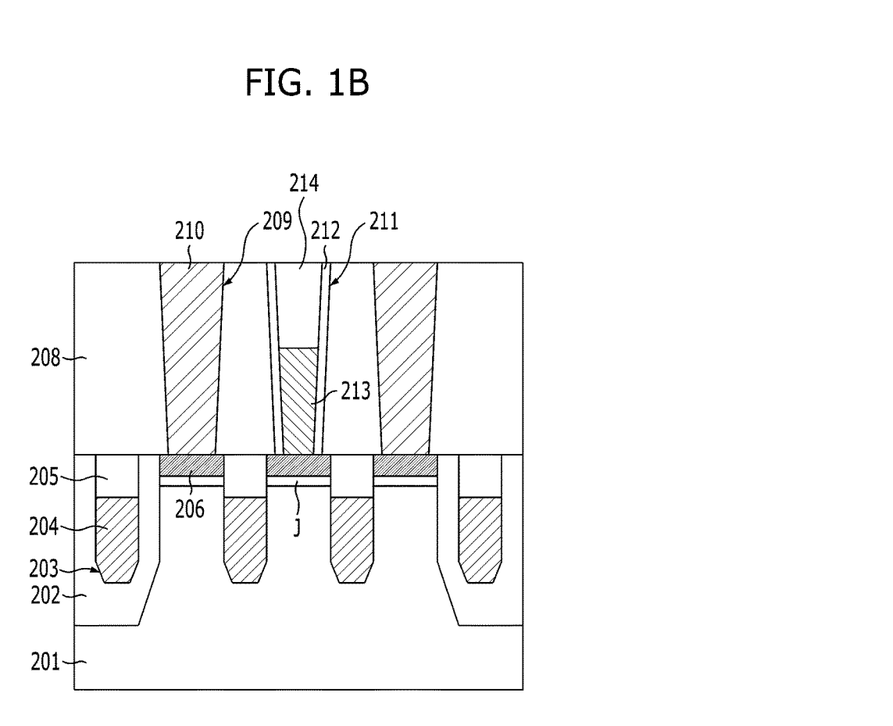
FIG. 1B is a cross-sectional view illustrating a semiconductor device in accordance with another embodiment of the present invention.

FIG. 1B is a cross-sectional view illustrating a semiconductor device in accordance with another exemplary embodiment of the present invention.

Referring to FIG. 1B, an isolation layer 202 for defining active regions in a substrate 201 is formed, and a silicide layer 206 is formed on the surface of the substrate 201. The silicide layer 206 may decrease the contact resistance between the substrate 201 and a conductive structure. The silicide layer 206 may be a titanium silicide layer or a cobalt silicide layer. It is also possible to form the silicide layer 206 of a material other than titanium silicide or cobalt silicide based on the characteristics required by a semiconductor device.

A plurality of buried gates are formed in the substrate 201. The buried gates may include trenches 203, a gate insulation layer (not shown), a gate electrode 204, and a sealing layer 205. The trenches 203 are formed by etching the silicide layer 206 and the substrate 201. The gate insulation layer (not shown) is formed on the surface of the trenches 203. The gate electrode 204 fills a portion of each trench 203 over the gate insulation layer (not shown). The sealing layer 205 fills the other portion of each trench 203 over the gate electrode 204. Junction regions J that contact with the bottom surface of the silicide layer 206 are formed in the substrate 201 under the silicide layer 206 whose shape is defined by the isolation layer 202 and the buried gates.

First openings 209 and second openings 211 are formed on the insulation layer 208 that covers the profile of the substrate 201. The first openings 209 expose the silicide layer 206 disposed on both sides of each active region. The second openings 211 expose the silicide layer 206 in the center of each active region. The first openings 209 may be a hole type, and the first openings 209 may be filled with contact plugs 210. The second openings 211 may be a line type, and the second openings 211 may be filled with conductive lines. The contact plugs 210 may be storage node contact plugs, and the conductive lines may be bit lines. The conductive lines may include bit line spacers 212 formed on the sidewalls of the second openings 211, a bit line conductive layer 213 filling a portion of each second opening 211 adjacent to the silicide layer 206, and a bit line hard mask layer 214 filling the other portion of each second opening 211 over the bit line conductive layer 213.

The semiconductor device that has the above structure may have decreased contact resistance between the substrate 201 and the contact plugs 210 and the conductive lines, regardless of the area and aspect ratio of the first openings 209 and the second openings 211, because the silicide layer 206, whose shape is defined by the isolation layer 202 and the buried gates, covers the entire contact area between the substrate 201, the contact plugs 210 and the conductive lines. In other words, because the area exposed by the first openings 209 and the second openings 211 may be substantially the same as the area of the silicide layer 206, or the area of the silicide layer 206 may be greater than the area exposed by the first openings 209 and the second openings 211, the contact resistance between the substrate 201 and the contact plugs 210, and between the substrate 201 and the conductive lines may be easily reduced.

FIGS. 2A to 2F are cross-sectional views illustrating a method for fabricating the semiconductor device shown in FIG. 1A in accordance with the exemplary embodiment of the present invention.

Figure 2A:
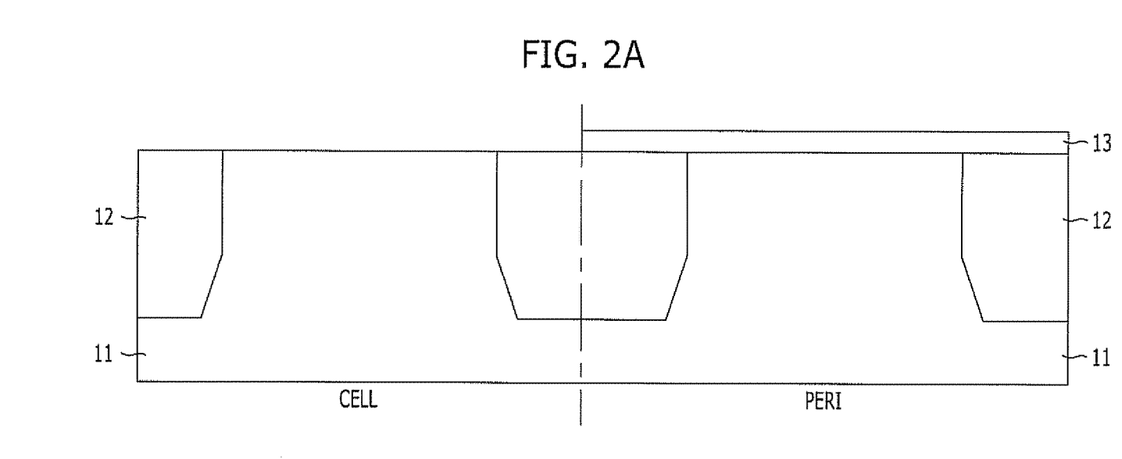
FIGS. 2A to 2F are cross-sectional views illustrating a method for fabricating the semiconductor device shown in FIG. 1A in accordance with an embodiment of the present invention.

Referring to FIG. 2A, a substrate 11 that includes a first region and a second region is prepared. The substrate 11 may be a silicon substrate. The first region may be a cell region where memory cells that includes switches, e.g., transistors, and information storages, e.g., capacitors, are formed. The second region may be a peripheral region that includes a controller for controlling the operation of the memory cells that are formed in the first region. Examples of the operation of the memory cells include a write operation or a read operation. Hereafter, for the sake of convenience in description, the first region is referred to as a cell region, and the second region is referred to as a peripheral region.

Subsequently, active regions are formed in each of the cell region and the peripheral region by forming an isolation layer 12 in the substrate 11. The active regions formed in the cell region may be a shape of islands or lines, and the active regions formed in the peripheral region may be a shape of islands. The linewidth of the isolation layer 12 and the gap between the lines or islands of the isolation layer 12 may be smaller than the linewidth and gap of the isolation layer 12 formed in the peripheral region, and the density of the isolation layer 12 formed in the cell region may be higher than the density of the isolation layer 12 formed in the peripheral region.

The isolation layer 12 defining the active regions in each of the cell region and the peripheral region may be formed through a Shallow Trench Isolation (STI) process. For example, the isolation layer 12 may be formed through a series of processes of forming trenches for isolation in the substrate 11, sequentially forming an interface layer, e.g., an oxide layer, and a liner layer, e.g., a nitride layer, on the surface of the trenches, and then forming a buried insulation layer, e.g., an oxide layer, for gap-filling the trenches. Herein, the isolation layer 12 formed in the cell region may include an interface layer and a liner layer and the isolation layer 12 formed in the peripheral region may include an interface layer, a liner layer, and a buried insulation layer based on the linewidth, gap, and density of the islands or lines of the isolation layer 12 formed in the cell region and the peripheral region.

Subsequently, a barrier layer 13 is formed over the substrate 11 of the peripheral region. The barrier layer 13 may be an insulation layer, e.g., an oxide layer. The barrier layer 13 formed over the substrate 11 of the peripheral region may be formed through a method of forming an insulation layer on the profile of the substrate 11 and then performing a patterning process by using a cell open mask.

Figure 2B:
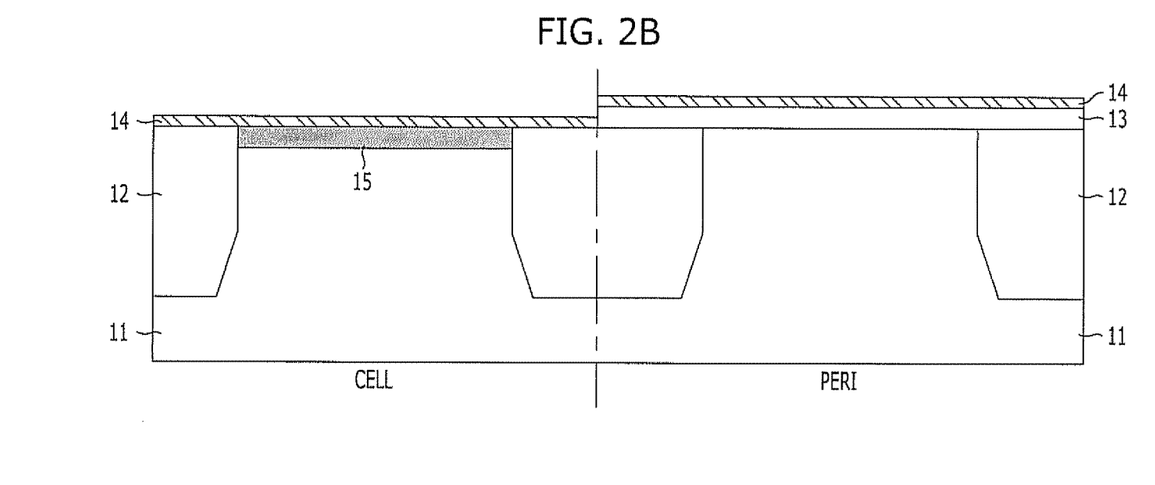

Referring to FIG. 2B, a metal layer 14 is formed on the profile of the substrate 11. The metal layer 14 is formed over the substrate 11 in the cell region, and the metal layer 14 is formed over the barrier layer 13 in the peripheral region. The metal layer 14 is used to form a silicide layer 15 on the surface of the substrate 11 through a subsequent process. The metal layer 14 may be a titanium (Ti) layer or a cobalt (Co) layer. The silicide layer 15 may be used to decrease the contact resistance of a conductive structure, e.g., contact plugs and conductive lines, which is formed in a subsequent process. A layer of a material other than titanium or cobalt may be used as the metal layer 14 for forming a silicide layer based on the characteristics required by a semiconductor device.

Meanwhile, a capping layer (not shown) may be further formed over the metal layer 14 to protect the metal layer 14 from being oxidized and may decrease the temperature of thermal treatment during a subsequent thermal treatment for forming a silicide layer.

Subsequently, a silicide layer 15 is formed on the surface of the substrate 11 in the cell region by performing a thermal treatment. The silicide layer 15 is formed on the surface of the active regions of the cell region, and the silicide layer 15 is not formed in the peripheral region due to the barrier layer 13. The thermal treatment may be performed through a furnace treatment or a Rapid Thermal Process (RTP) at a temperature ranging from approximately 400° C. to approximately 800° C.

Figure 2C:
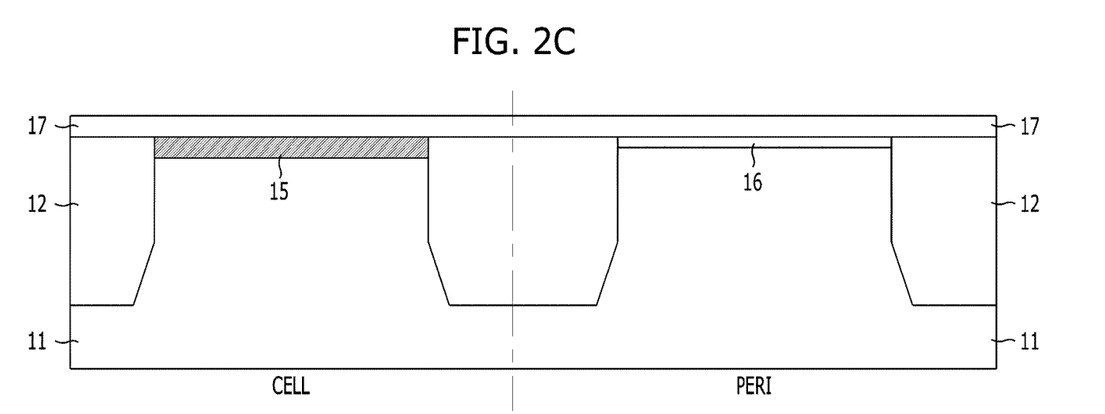

Referring to FIG. 2C, the metal layer 14 remaining unreacted after the thermal treatment is removed, and the barrier layer 13 formed in the peripheral region is removed. The metal layer 14 and the barrier layer 13 may be removed using diverse echant (or cleaning agent) and diverse etching methods.

Subsequently, a peripheral gate insulation layer 16 is formed over the substrate 11 of the peripheral region. The peripheral gate insulation layer 16 may be formed through a thermal oxidation process. When the peripheral gate insulation layer 16 is formed through a thermal oxidation process, the peripheral gate insulation layer 16 may be formed on the surface of the active regions of the peripheral region.

Subsequently, a protective layer 17 is formed on the profile of the substrate 11. The protective layer 17 protects the surface of the substrate 11, which includes the silicide layer 15, from being damaged during a subsequent process. The protective layer 17 may be an insulation layer. The protective layer 17 may include an oxide layer, a nitride layer, or an oxynitride layer, or a stacked layer thereof.

Figure 2D:
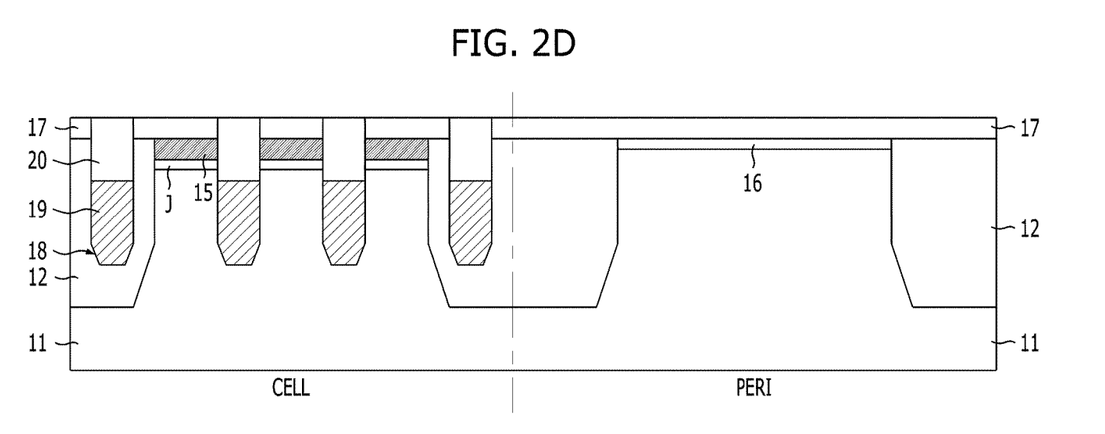

Referring to FIG. 2D, a mask pattern (not shown) for forming buried gates in the cell region is formed, and then a plurality of trenches 18 may be formed by using the mask pattern (not shown) as an etch barrier and etching the protective layer 17, the silicide layer 15, and the substrate 11.

Subsequently, after the mask pattern (not shown) is removed, buried gates are formed in the trenches 18. The buried gates may include a gate insulation layer (not shown), a gate electrode 19, and a sealing layer 20. The buried gates may be formed through a series of process for forming a gate insulation layer on the surface of the trenches 18, forming a gate electrode 19 that fills a portion of each trench 18 over the gate insulation layer, forming a sealing layer 20 on the profile of the substrate 11, and performing a planarization process until the protective layer 17 is exposed so that the sealing layer 20 is buried in the other portion of each trench 18.

Meanwhile, although not illustrated in the drawing, junction regions J may be formed in the substrate 11 under the silicide layer 15 after the buried gates are formed. The junction regions J may be formed through an ion implantation process, and the junction regions J may be formed to contact with the bottom surface of the silicide layer 15.

Figure 2E:
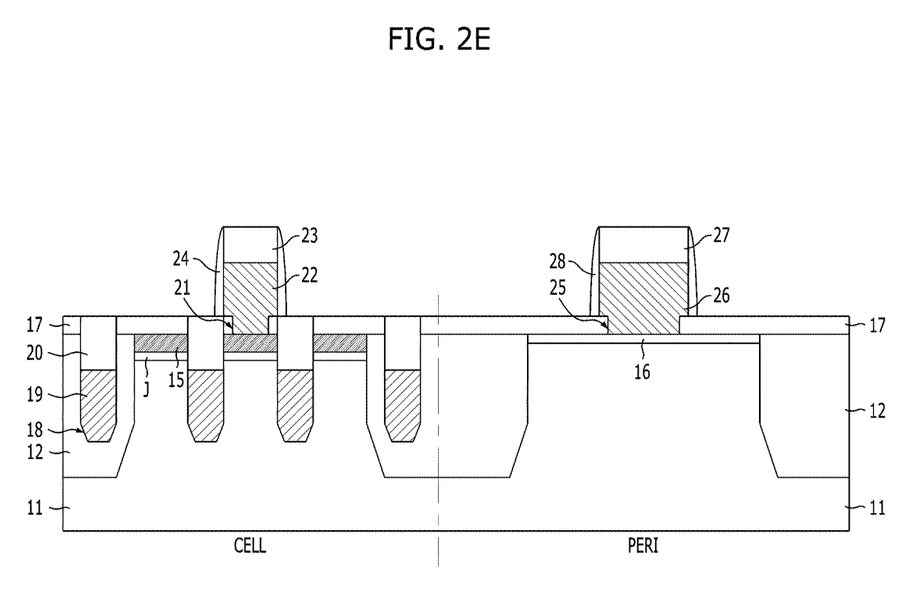

Referring to FIG. 2E, first openings 21 and second openings 25 are simultaneously formed in the cell region and the peripheral region, respectively, by selectively etching the protective layer 17. The first openings 21 are used for contacts between the substrate 11 and bit lines 22, while the second openings 25 are used for forming peripheral gates.

Subsequently, a conductive layer is formed to fill the first openings 21 and the second openings 25 and cover the protective layer 17. The conductive layer may be a semiconductor layer, such as a silicon layer, a metallic layer, or a stacked layer where a semiconductor layer and a metallic layer are stacked.

Subsequently, a bit line hard mask layer 23 is formed over the conductive layer of the cell region and at the same time, a peripheral gate hard mask layer 27 is formed over the conductive layer of the peripheral region. The linewidth of the bit line hard mask layer 23 may be formed substantially the same as the linewidth of the first openings 21, or the linewidth of the bit line hard mask layer 23 may be formed wider than the linewidth of the first openings 21. Also, the linewidth of the peripheral gate hard mask layer 27 may be formed substantially the same as the linewidth of the second openings 25, or the linewidth of the peripheral gate hard mask layer 27 may be formed wider than the linewidth of the second openings 25.

Subsequently, by using the bit line hard mask layer 23 and the peripheral gate hard mask layer 27 as etch barriers and etching the conductive layer, the bit lines 22 that contacts with the silicide layer 15 through the first openings 21 are formed in the cell region. At that time, a peripheral gate electrode 26 is formed in the peripheral region.

Subsequently, spacers 24 and 28 are formed on the sidewalls of the bit lines 22 and the peripheral gate electrode 26.

Figure 2F:
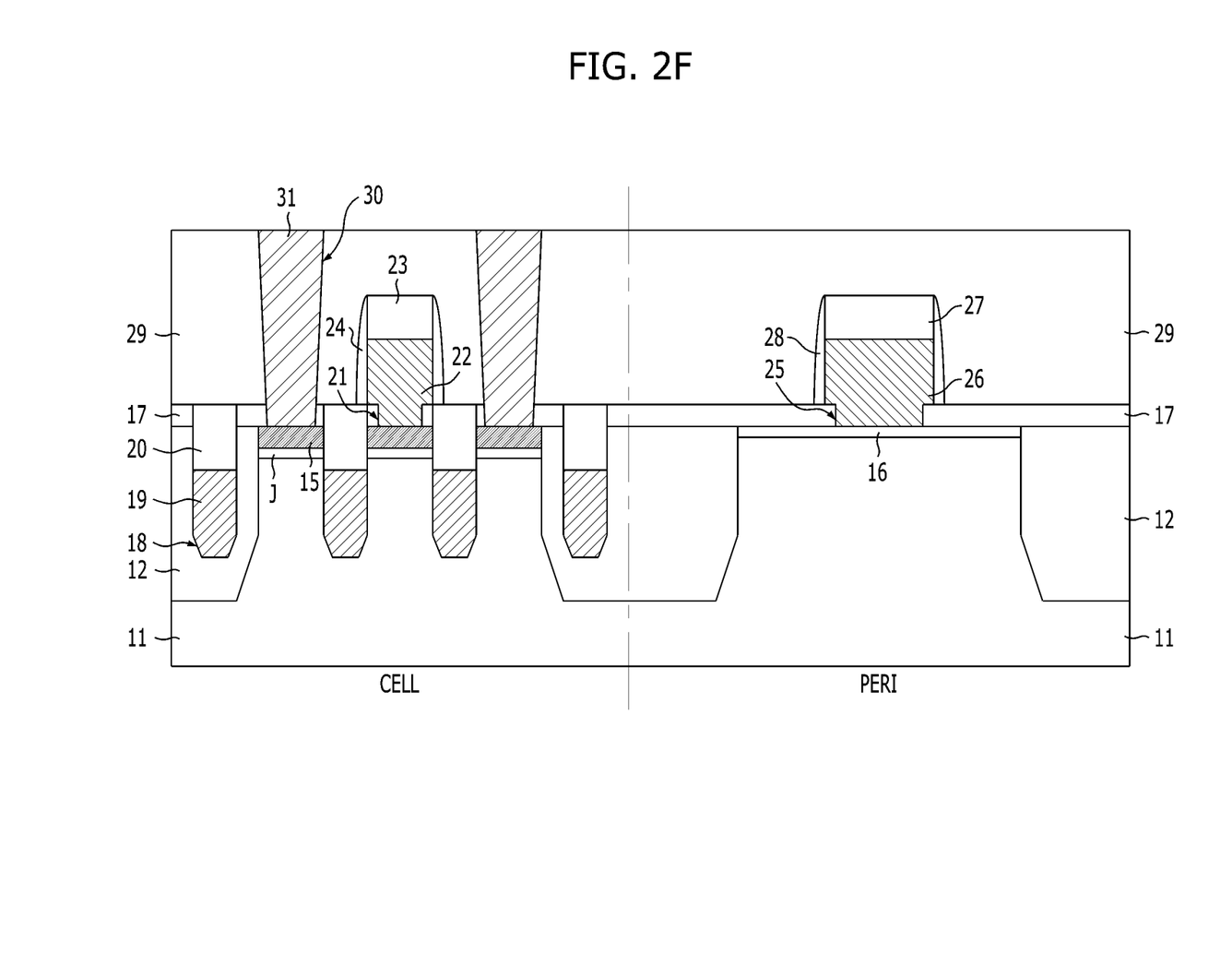

Referring to FIG. 2F, an inter-layer dielectric layer 29 is formed on the profile of the substrate 11. The inter-layer dielectric layer 29 may be formed to cover the bit lines 22 and the peripheral gates. The inter-layer dielectric layer 29 may include an oxide layer, a nitride layer, or an oxynitride layer, or a stacked layer thereof.

Subsequently, third openings 30 that expose the silicide layer 15 formed on both sides of each bit line 22 are formed by selectively etching the inter-layer dielectric layer 29 and the protective layer 17 in the cell region. The third openings 30 may be a hole type.

Subsequently, storage node contact plugs 31 are formed by filling the third openings 30 with a conductive material.

The fabrication of the semiconductor device is completed by subsequently performing the known fabrication process.

Figure 3A:
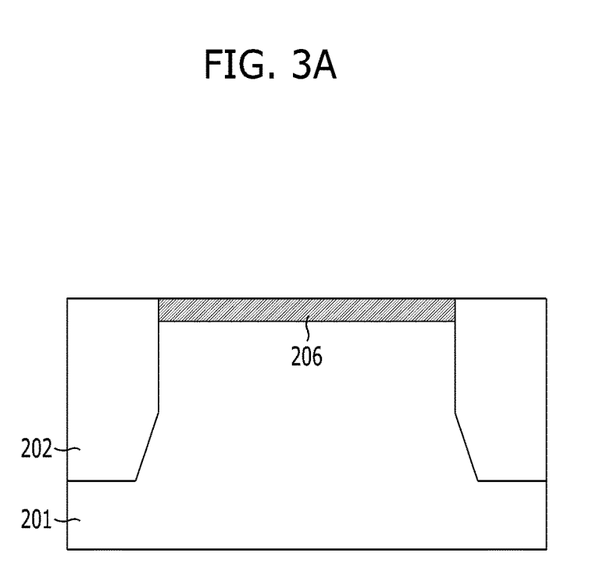
FIGS. 3A to 3H are cross-sectional views illustrating a method for fabricating the semiconductor device shown in FIG. 1B in accordance with an embodiment of the present invention.
Figure 3B:
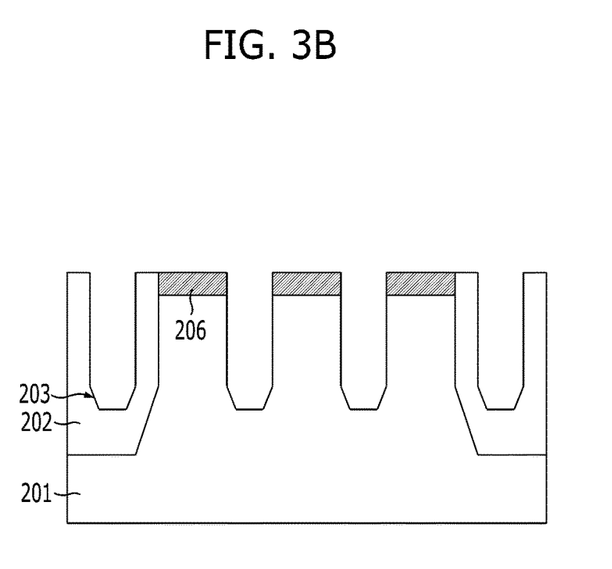
Figure 3C:
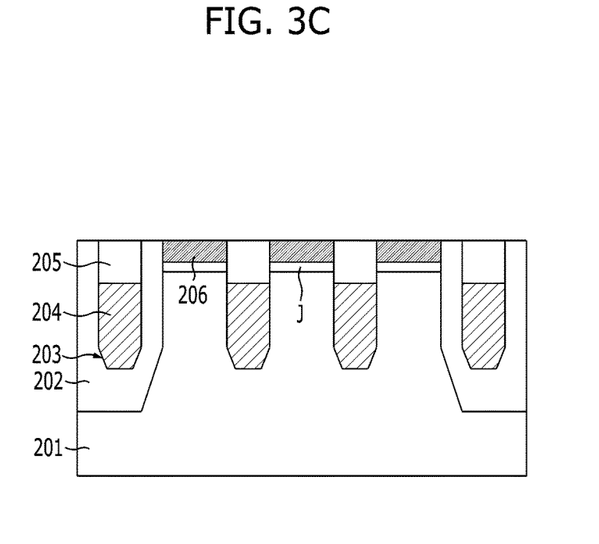
Figure 3D:
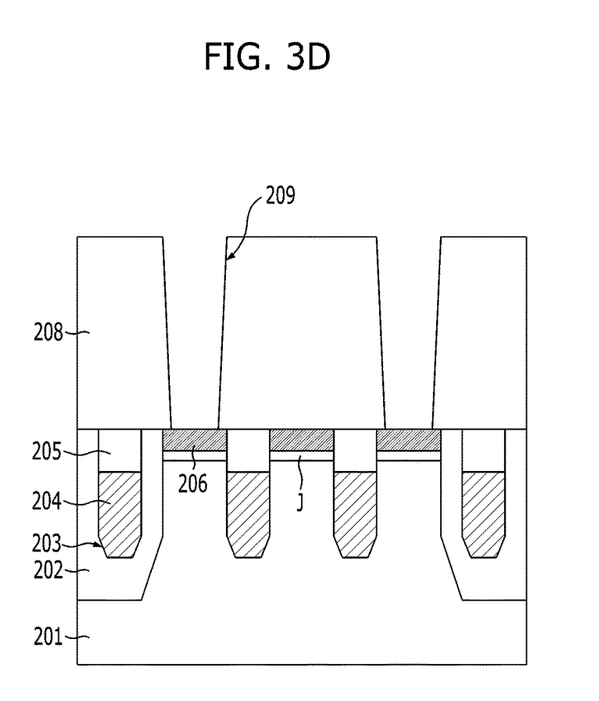
Figure 3E:
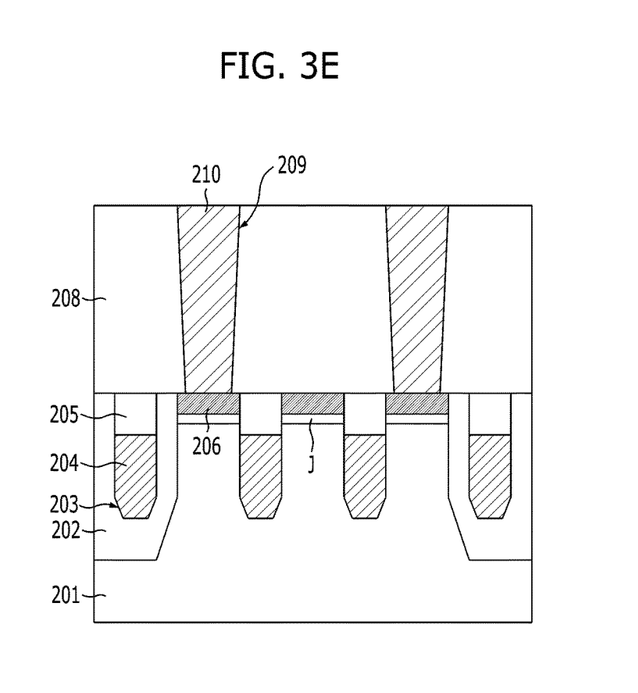
Figure 3F:
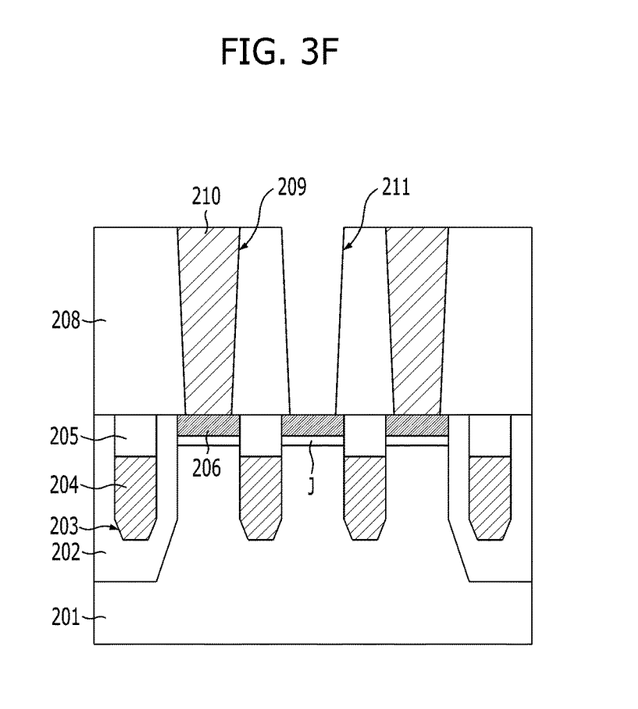
Figure 3G:
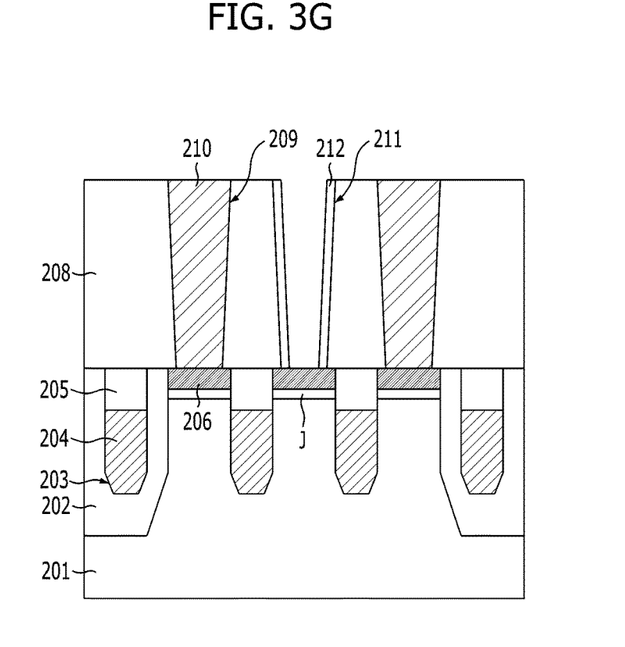
Figure 3H:
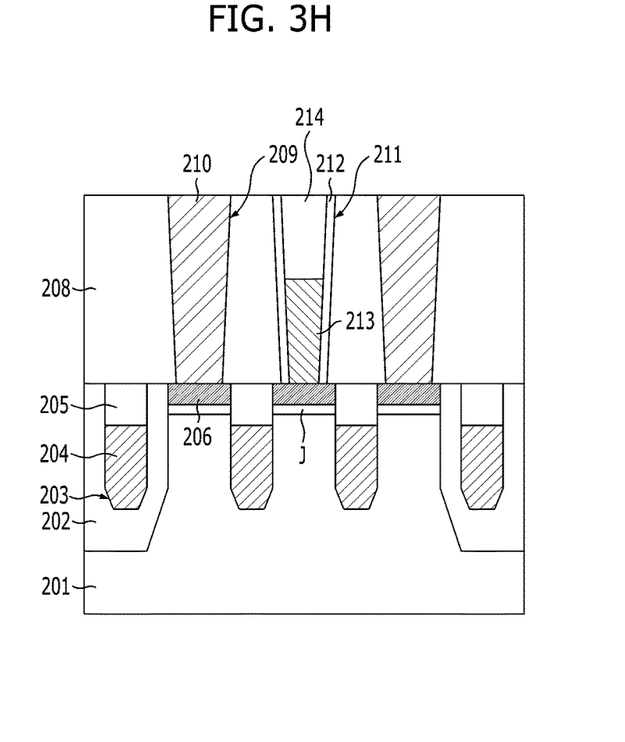

The method of fabricating the semiconductor device illustrated in FIG. 1B is quite similar to the semiconductor device fabrication process that has been described above, except the process for forming the bit lines. The bit lines of the semiconductor device illustrated in FIG. 1B may be formed by forming line-type openings that expose the silicide layer, forming spacers on the sidewalls of the openings, filling a portion of each opening, and forming an insulation layer that fills the other portion of each opening. Referring to FIG. 3A, an isolation layers 202 and active regions are formed in a substrate 201, wherein each of the active regions is formed between the isolation layers 202. A silicide layer 206 is formed in each of the active regions. Referring to FIG. 3B, trenches 203 and silicide layer patterns 206 are formed simultaneously by etching the silicide layer 206 in each of the active regions, wherein each of trenches 203 is located between the silicide layer patterns 206. Referring to FIG. 3C, a buried gate 204/205 is formed in each of the trenches 203. The silicide layer patterns 206 are formed before the buried gate 204/205 is formed. A junction regions J are formed under the silicide layer patterns 206, respectively. The junction regions J are formed through an ion implantation, after the buried gate 204/205 is formed. Each of the junction regions J contacts a bottom surface of each of the silicide layer patterns 206. Referring to FIG. 3D, an inter-layer dielectric layer 208 is formed to cover the buried gate 204/205 and the silicide layer patterns 206. A first opening 209 is formed to expose one silicide layer pattern 206 among the silicide layer patterns 206 by selectively etching the inter-layer dielectric layer 208. The first opening 209 is formed in a hole shape. Referring to FIG. 3E, a contact plug 210 is formed by filling the first opening 209 with a conductive material. Referring to FIG. 3F, a second opening 211 is formed to expose another silicide layer pattern 206 among the silicide layer patterns 206 by selectively etching the inter-layer dielectric layer 208. The second opening 211 is formed in a line shape. Referring to FIG. 3G, a spacer 212 is formed over sidewalls of the second opening 211. Referring to FIG. 3H, a conductive line 213 is formed to partially fill the second opening 211. The conductive line 213 may include a bit line. An insulation layer 214 is formed to fill the second opening 211 and is provided over the conductive line 213.

According to the exemplary embodiment of the present invention, contact resistance may be decreased by forming a silicide layer before the formation of openings regardless of the linewidth and aspect ratio of the openings. Also, since it does not have to consider step coverage based on the aspect ratio of openings, there is no limitation in the method of depositing a metal layer. Therefore, productivity may be improved.

Moreover, because a silicide layer is formed before a given structure, such as buried gates, is formed, the burden of thermal treatment for forming the silicide layer may be alleviated.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming isolation layers and active regions in a substrate, wherein each of the active regions is formed between the isolation layers;
    forming a silicide layer in each of the active regions;
    forming trenches and silicide layer patterns simultaneously by etching the silicide layer in each of the active regions,
    wherein each of the trenches is located between the silicide layer patterns;
    forming a buried gate in each of the trenches;
    forming an inter-layer dielectric layer that covers the buried gate and the silicide layer patterns; and forming a first opening that exposes one silicide layer pattern among the silicide layer patterns by selectively etching the inter-layer dielectric layer, wherein the silicide layer patterns are formed before the buried gate is formed.

2. The method of claim 1, further comprising:

forming a contact plug by filling the first opening with a conductive material, wherein the first opening is formed in a hole shape.

3. The method of claim 1, further comprising:

forming a second opening that exposes another silicide layer pattern among the silicide layer patterns by selectively etching the inter-layer dielectric layer;

forming a spacer over sidewalls of the second opening;

forming a conductive line that partially fills the second opening; and forming an insulation layer that fills the second opening and is provided over the conductive line, wherein the second opening is formed in a line shape.

4. The method of claim 1, further comprising:

forming junction regions under the silicide layer patterns, respectively; and wherein the junction regions are formed through an ion implantation after the buried gate is formed, and wherein each of the junction regions contacts a bottom surface of each of the silicide layer patterns.

5. The method of claim 3, wherein the conductive line includes a bit line.

* * * * *